United States Patent
Perner et al.

(10) Patent No.: US 7,002,197 B2
(45) Date of Patent: Feb. 21, 2006

(54) CROSS POINT RESISTIVE MEMORY ARRAY

(75) Inventors: Frederick A. Perner, Palo Alto, CA (US); Manish Sharma, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 57 days.

(21) Appl. No.: 10/814,094

(22) Filed: Mar. 30, 2004

(65) Prior Publication Data

US 2005/0161715 A1    Jul. 28, 2005

Related U.S. Application Data

(63) Continuation-in-part of application No. 10/764,052, filed on Jan. 23, 2004, now abandoned.

(51) Int. Cl.
*H01L 29/76* (2006.01)

(52) U.S. Cl. .................................. 257/295; 257/296
(58) Field of Classification Search ............ 257/298, 257/296, 295
See application file for complete search history.

(56) References Cited

U.S. PATENT DOCUMENTS

| 3,841,904 | A | * | 10/1974 | Chiang | 438/581 |
| 5,940,319 | A | * | 8/1999 | Durlam et al. | 365/171 |
| 6,462,388 | B1 | * | 10/2002 | Perner | 257/390 |

* cited by examiner

*Primary Examiner*—David Nelms
*Assistant Examiner*—Thinh T Nguyen

(57) ABSTRACT

A cross point resistive memory array has a first array of cells arranged generally in a plane. Each of the memory cells includes a memory storage element and is coupled to a diode. The diode junction extends transversely to the plane of the array of memory cells.

7 Claims, 5 Drawing Sheets

CROSS POINT RESISTIVE MEMORY ARRAY

RELATED APPLICATIONS

This patent application is a continuation-in-part (CIP) of patent application Ser. No. 10/764,052, titled "CROSS POINT RESISTIVE MEMORY ARRAY", filed Jan. 23, 2004, now abandoned.

FIELD OF THE INVENTION

The present invention relates information storage devices. More specifically, the invention relates to cross point resistive memory arrays. In particular, although not exclusively, the invention may have application to magnetic random access memory ("MRAM") devices.

BACKGROUND

Many different resistive cross point memory cell arrays have been proposed, including resistive cross point memory cell arrays having MRAM elements, phase change memory elements, resistive polymer memory elements, polysilicon memory elements, and write-once (eg. fuse based or antifuse based) resistive memory elements.

Consider the example of an MRAM device including a resistive cross point array of spin dependent tunnelling (SDT) junctions, word lines extending along rows of the SDT junctions, and bit lines extending along columns of the SDT junctions. Each SDT junction is located at a cross point of a word line and a bit line. The magnetization of each SDT junction assumes one of two stable orientations at any given time. These two stable orientations, parallel and anti-parallel, represent logic values of '0' and '1'. The magnetization orientation, in turn, affects the resistance of the SDT junction. Resistance of the SDT junction is a first value (R) if the magnetization orientation is parallel and a second value (R+ΔR) if the magnetization orientation is anti-parallel. The magnetization of the SDT junction and, therefore, its logic value may be read by sensing its resistance state by passing a current through the junction generating a voltage from the magnetic resistance of the cell. Thus the magnetoresistance contains the information on the state of that cell.

A write operation on a selected SDT junction is performed by supplying write currents to the word and bit lines crossing the selected SDT junction. The currents create two external magnetic fields that, when combined, switch the magnetization orientation of the selected SDT junction from parallel to anti-parallel or vice versa.

However, since the junctions are essentially resistors, problems arise in read and write sensitivity as a result of shunt currents passing through junctions other than the selected junction. Such problems are eliminated by placing an electronic switch between the word and bit lines in series with each magnetic cell. Such a device can be a diode or transistor.

A known form of a diode integrated into a magnetic storage element is constructed by building up the various layers of the diode and the magnetic storage element. These layers include p and n layers of the diode followed by the layers of the magnetic storage element including two magnetoresistive layers separated by a non-magnetic layer such as aluminium oxide. Once the required number of layers has been built up, etching takes place to form an array of memory cells each incorporating an integrated diode and magnetic storage element. The diode junction is thus arranged generally parallel with the layers of the magnetic storage element and is also generally parallel with the general plane of the MRAM array.

Another known form of a cross point resistive memory array has memory cells each built on a pillar diode structure. However the equivalent circuit of each memory cell includes a tunnel gate surface effect transistor having non-uniform gate oxide built on the pillar diode structure. Thus, the pillar diode does not function as a diode in the forward conducting direction. Further, the control gate prevents sneak path currents through the memory cell.

It is desirable to resist shunt currents through non-selected junctions of a cross point resistive memory device.

SUMMARY OF THE INVENTION

In accordance with a first aspect of the present invention, there is provided a cross point resistive memory device which comprises a first array of memory cells arranged generally in a plane. Each of the memory cells includes a memory storage element having a diode coupled thereto to control the current through the memory storage element. The diode includes a first region of material of a first conducting type and a second region of material of a second conducting type. A junction is defined between the first region and the second region and the junction extends transversely to the plane of the array of memory cells. The memory device is operable to pass current through a selected one of the memory storage elements with the junction of the coupled diode forward conducting.

BRIEF DESCRIPTION OF THE DRAWINGS

In order that the invention may be more fully understood, one embodiment will now be described by way of example with reference to the drawings in which.

DETAILED DESCRIPTION OF THE PREFERRED EMBODIMENTS

The figures illustrate an MRAM device but it will be appreciated that the device is not limited to MRAM and may include memory cells of the type including phase change memory cells, a resistive polymer memory cell, a polysilicon memory cell, or a write-once (eg. fuse based or anti-fuse based) resistive memory cell.

Figure 1:
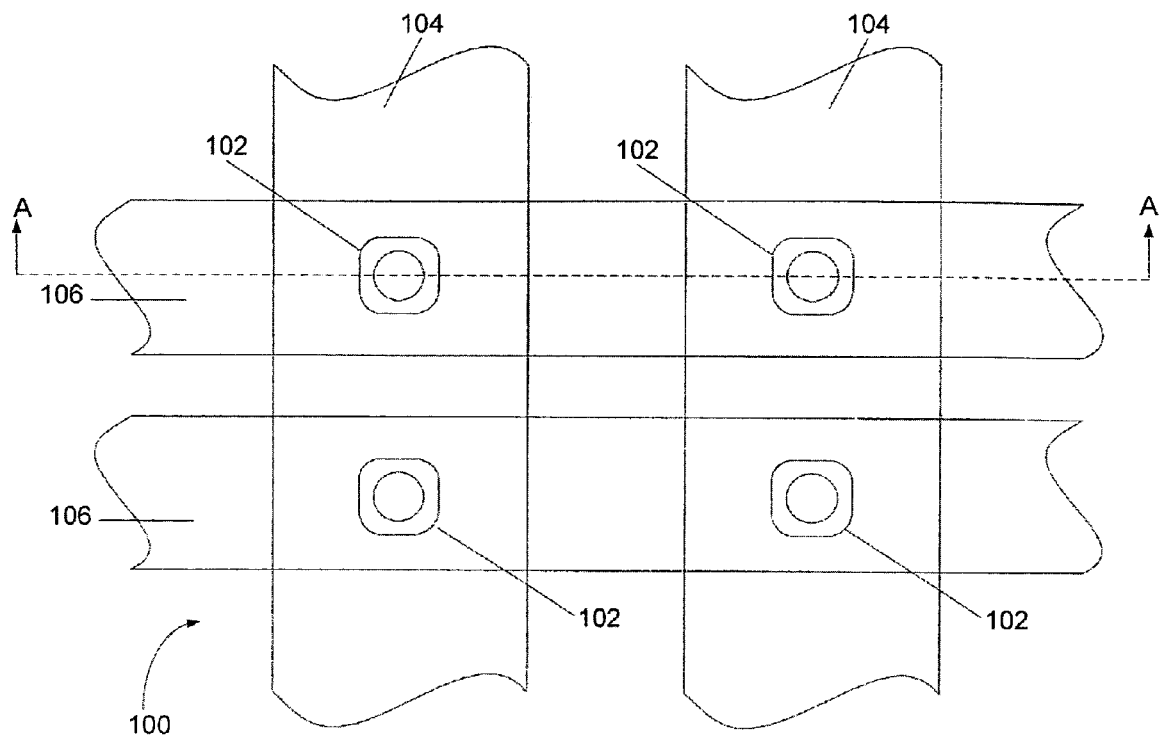
FIG. 1 is a plan view of a portion of a magnetic random access memory ("MRAM") device in accordance an embodiment of the present invention.
Figure 2:
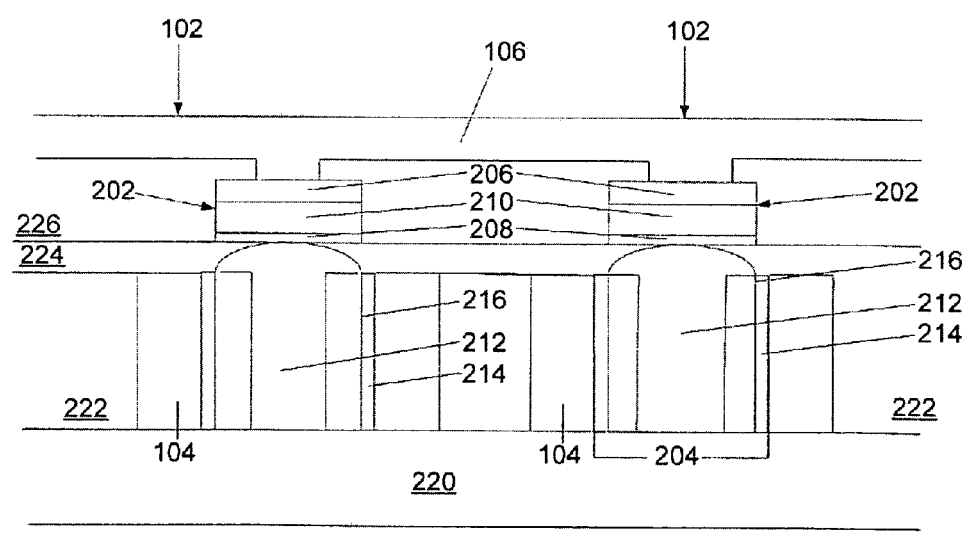
FIG. 2 is a cross-sectional view through A—A of FIG. 1 according to one embodiment.

FIGS. 1 and 2 illustrate a preferred form of the magnetic random access memory device 100. As shown, the device includes four memory cells 102 arranged in a planar array. While only four memory cells have been shown in FIG. 1, it will be appreciated that the array may be many times larger.

The memory cells 102 are cross-linked by bottom line conductors 104 and top line conductors 106. The line conductors are made from copper formed by a copper damascene process as will be explained further below.

As can be seen from FIG. 2, each of the memory cells 102 comprises a magnetic storage element 202 integrated with a current control element in a form of a diode pillar 204. The magnetic storage element and the diode pillar are connected in series.

The magnetic storage element could be any element having a resistance that is dependent upon its magnetic state. Examples of such elements include magnetic tunnel junctions such as spin dependent tunnelling junctions (SDT), giant magnetoresistance (GMR) spin valves and colossal magnetoresistance memory cells (CMR). The basic magnetic storage element consists of two magnetoresistive layers 206, 208 which may for instance be formed of GMR film. These two layers 206, 208 are separated by a layer of non-magnetic material serving as an insulator 210. Examples include $Al_2O_3$, MgO, $Ta_2O_2$, AlN, $SiO_2$, $HfO_2$, $ZrO_2$, BN and others. While the magnetic storage elements 202 have been described as incorporating three basic layers, it will be appreciated that more complex structures may be employed. For example, one of the magnetoresistive layers may be "pinned" with a layer of anti-ferromagnetic material. When the magnetoresistive layer is "pinned" it serves as a reference layer while the magnetic state of the other magnetoresistive layer is reversible. Additional layers include capping and seed layers.

The diode pillar 204 comprises a central core 212 of n doped silicon. The central core 212 is surrounded by a circumferential layer 214 of platinum silicide forming a p type region of a Schottky diode. The central core 212 of the silicon pillar is connected to the bottom magnetoresistive layer 208 of the magnetic storage element 202.

Each diode pillar 204 is disposed within one of the bottom conductor lines 104 such that the conductor line 104 surrounds the diode pillar 204. The top magnetoresistive layer 206 is connected to one of the top conductor lines 106. As will be appreciated from FIG. 1, each of the diode pillars 204 within a column of memory cells 102 is connected to a common line conductor 104. Further, each of the magnetic storage elements within a row of memory cells 102 will be connected to a common top conductor 106. Thus a crosslinked structure is formed as per the equivalent circuit model shown in FIG. 3.

While the preferred embodiment illustrated in FIG. 2 shows the diode 204 in the form of a pillar, it will be appreciated that other diode structures are possible, provided that the diode junction 216 extends transversely compared to the layers 206, 208, 210 of the magnetic storage element 202. In other words, the diode junction 216 extends transversely to the general plane of the MRAM array. Thus, the surface area of the diode junction 216 can be controlled according to the length of the pillar structure. Thus, the surface area of the diode junction will be less significant in determining the smallest possible dimension for the memory cell 102 and hence the compactness which can be achieved in the MRAM array.

An alternative construction for diode 204 is a rectangular body of silicon with material of the opposite conductivity type disposed on one side or all four sides of the rectangular body. In an alternative construction, a first region of a first conducting type material may be placed adjacent a second region of a second type conducting material, provided the junction therebetween extends transversely to the layers of the magnetic storage element 202 and/or the general plane of the MRAM array 100. Furthermore, instead of a diode, an appropriately connected transistor may be employed.

As discussed above, the diode pillar 204 is disposed within the bottom conductor 104. However, other arrangements are possible. For example, the bottom conductor could be disposed beneath the diode pillar 204. Alternatively, the bottom conductor 104 may be connected only on one side of the diode pillar 204.

As will be explained further in connection with FIGS. 4 to 11, the memory cells 102 are constructed on a substrate 220. A first dielectric material 222 is disposed between the bottom conductor lines 104. A second dielectric material 224 is disposed in a layer between the top of the line conductors 104 and the bottom of the magnetic storage elements 202. A third dielectric material 226 forms a layer surrounding the magnetic storage elements 202. A fourth dielectric material (not shown) is provided to fill the regions between the top line conductors 106. These dielectric materials may be the same or one or more of these dielectric materials may be different.

Figure 3:
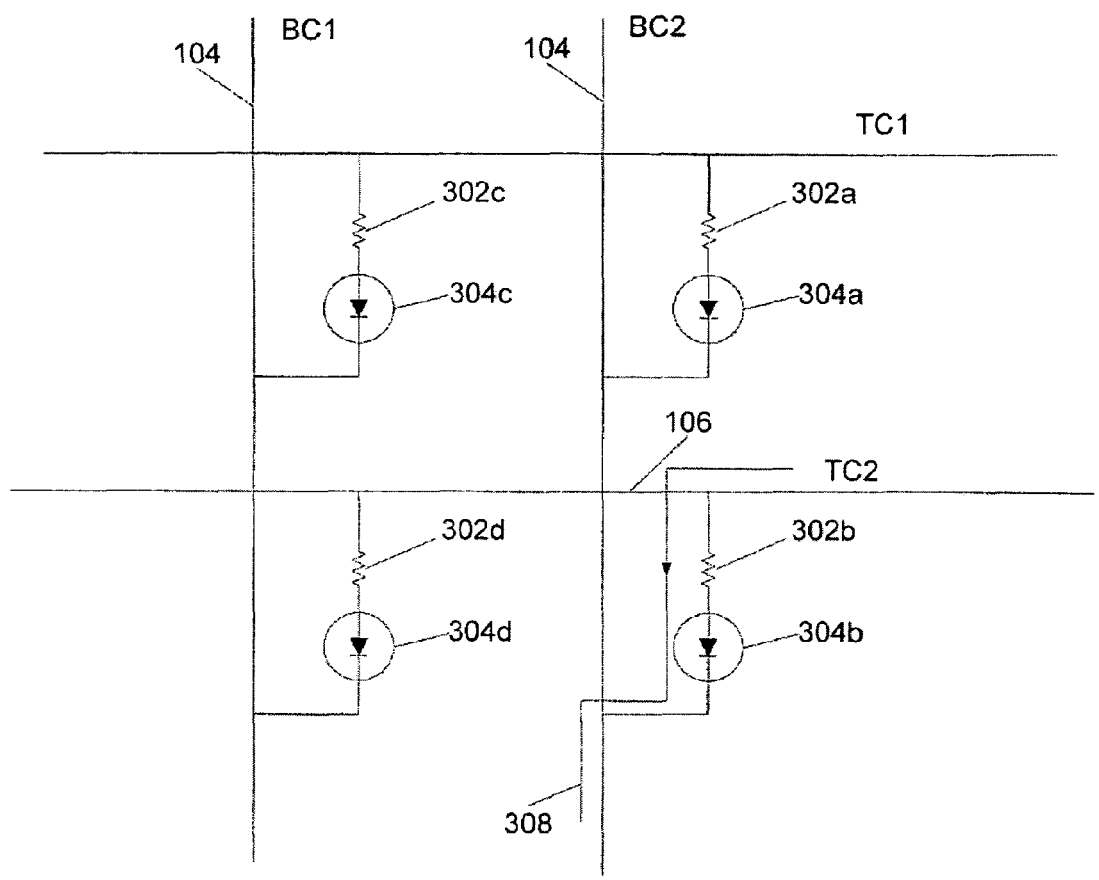
FIG. 3 is an equivalent circuit model of the MRAM device of FIG. 1.

FIG. 3 illustrates an equivalent circuit model for the MRAM array of FIG. 1. Each of the magnetic storage elements 202 is represented as a resistive element 302a–302d. Each of the diode pillars 204 is depicted as a diode element 304a–304d. To distinguish between the conductors, bottom line conductors 104 are labelled BC1 and BC2 while top line conductors 106 are labelled TC1 and TC2.

In the operation of reading the state in selected MRAM cell 302b, TC2 and BC2 are activated. The activation produces a sense current flowing from TC2 through MRAM cell 302b, through diode 304b to bottom conductor BC2 as depicted by solid arrow 308. The sense current causes a voltage drop across magnetic storage element 302b dependant upon the direction of magnetic vectors within the magnetic storage element 302b. The voltage drop can be detected by additional circuitry (not shown) to determine the logic state stored in the magnetic storage element 302b. No sub-current flow can detour around the target MRAM cell 302b because diodes 304a, 304c and 304d prohibit the sub-current from flowing through the MRAM cells 302a, 302c and 302d.

Further, when logic states are to be written in the magnetic storage element 302b, bottom conductor BC2 and top conductor TC2 are activated to produce respective currents therein. These bottom and top line currents generate magnetic fields in the magnetic storage element 302b, and a combination of these magnetic fields switches magnetic vectors in magnetic storage element 302b to a desired direction. The activation of BC2 and TC2 do not affect or change the states in the other MRAM cells 302a, 302c and 302d.

A beneficial effect is achieved by the disposition of the diode pillars within the bottom conductor lines 104. As will be appreciated from FIG. 2, this arrangement causes a constriction in the bottom line conductor 104 in the region around the posts. This increases local current density and thereby increases the induced magnetic field coupled to the memory cell. Thus, the bottom line conductors can carry lower currents than would ordinarily be required to achieve the required switching magnetic field.

Turning to FIGS. 4 to 11, a method of fabricating the MRAM array is schematically illustrated. While the construction is illustrated in connection with the formation of a single memory cell, it will be appreciated that the method would ordinarily be conducted in a batch process, simultaneously building up multiple memory cells organised into an array on a single substrate 220.

While the semi-conductor elements of the present invention rely on a silicon based technology, it will be appreciated that other semi-conductor material may be employed such as germanium, carbon, indium, telluride, antimony, antimony telluride.

Figure 4:
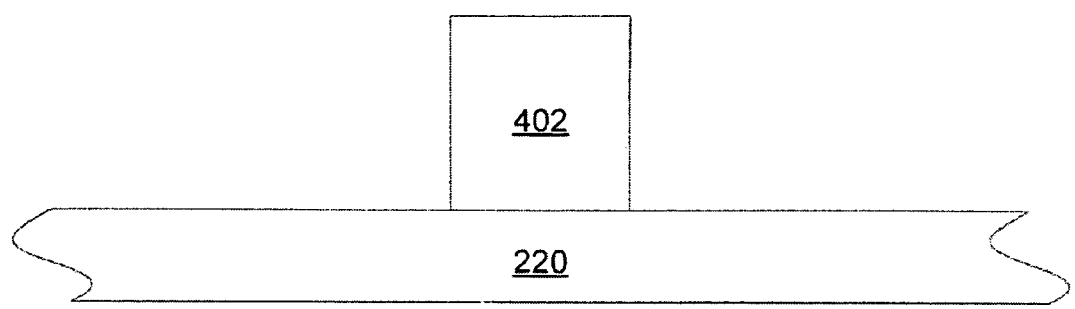
FIGS. 4 to 11 illustrate the process for forming a magnetic random access memory cell of the array illustrated in FIG. 1.
Figure 5:
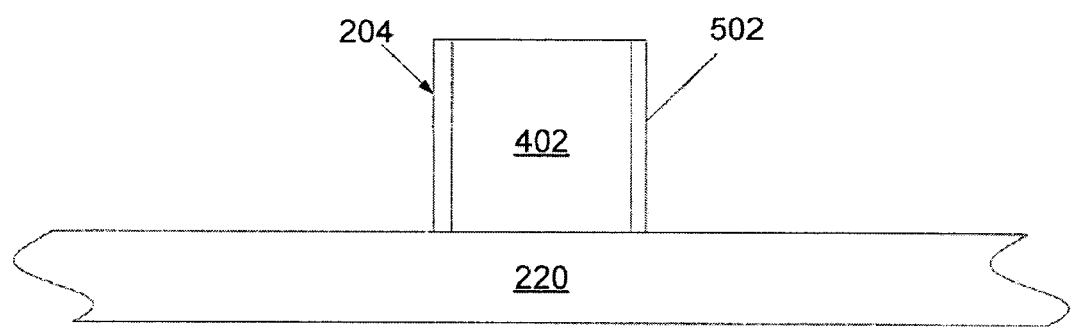

FIG. 4 illustrates a column 402 of n type silicon formed on a substrate 220. The material for the silicon column may be grown in a layer by conventional epitaxial methods on the substrate 220. The silicon column may then be formed by deep anisotropic etching in the vertical direction. However, alternative methods of forming the silicon column may be employed. For example, the silicon pillars may be constructed of amorphous or polycrystalline silicon. The process may involve the low temperature deposition of one or several layers of silicon, either in amorphous or polycrystalline phase. In a preferred form of the invention plasma-enhanced chemical vapour deposition (PECVD) is employed. Other techniques include pulsed laser deposition (PLD) which involves irridating the silicon following the introduction of dopants. This results in the crystallization of the silicon and simultaneously in the activation of the dopants via ultra fast melting and solidification. The silicon material can be patterned by etching either before or after re-crystallisation.

Such low temperature deposition processes may be carried out with relatively little heating of the underlying substrate 220. Accordingly, the silicon pillar can therefore be constructed on low temperature substrates such as ceramics, dielectrics, glass or polymers. Furthermore, as the process preserves the substrate, the silicon columns can be constructed over underlayers and structures such as silicon integrated circuits. It will therefore be appreciated that through the use of lower temperature deposition of amorphous or polycrystalline silicon, multiple layers of arrays may be built up one atop the other. In the preferred embodiment, the silicon pillar 402 is built over a planarized dielectric layer or a quartz layer.

After deposition of the silicon layer and patterning into silicon columns, platinum is deposited onto the silicon columns. The deposition may be conducted either by vapour deposition or electroplating. Following the deposition of platinum, the platinum is selectively etched on the horizontal surfaces to leave platinum deposited on the side walls. A high temperature anneal then occurs to form platinum silicide at the surface. The platinum silicide forms a p type semi-conductor material formed as a circumferential layer 502 surrounding the n type silicon core 402. A p-n junction thereby exists at the boundary between the n type silicon core 402 and the circumferential layer 502 of platinum silicide. A Schottky diode is thereby formed.

Figure 6:
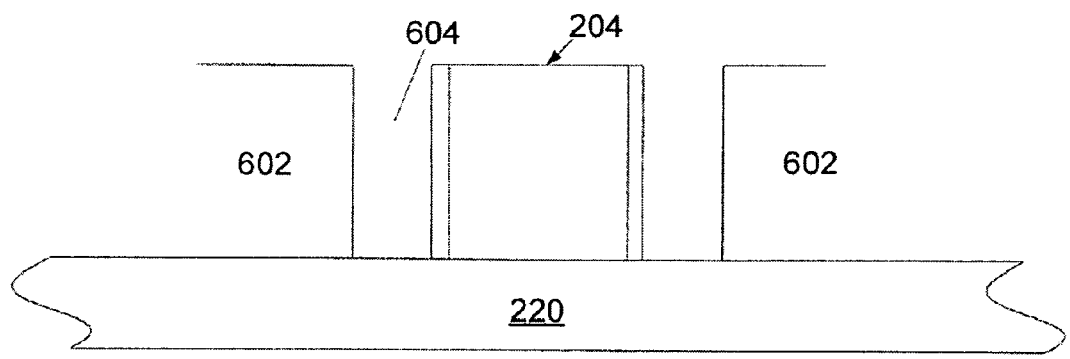

Dielectric material is then deposited onto the substrate 220 and planarized level with the top of the pillar diode 204. The dielectric material is then patterned by selective vertical etching to form a trench 604 as shown in FIG. 6. The trench 604 forms a void surrounding the pillar diode 204 as well as other pillar diodes in the same column of pillar diodes.

Figure 7:
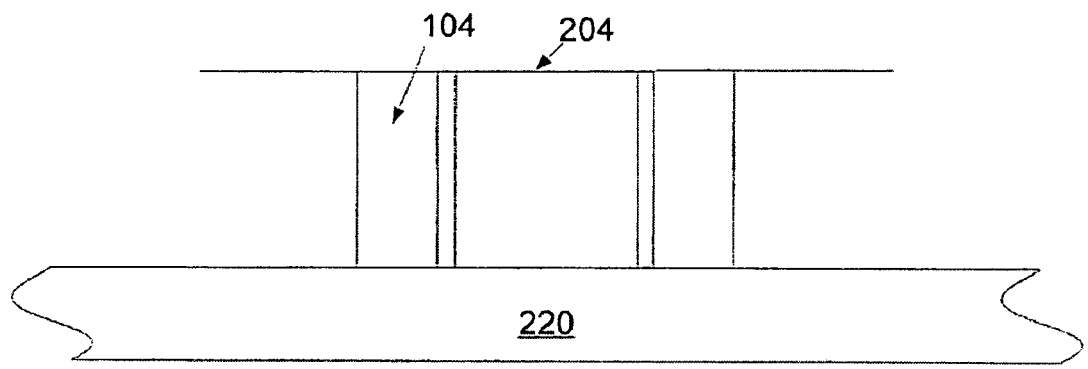

As per FIG. 7, the trench 604 is filled with copper by a copper damascene process to form bottom conductor line 104 surrounding the pillar diode 204. The copper is planarized with the top of the pillar diode 204.

Figure 8A:
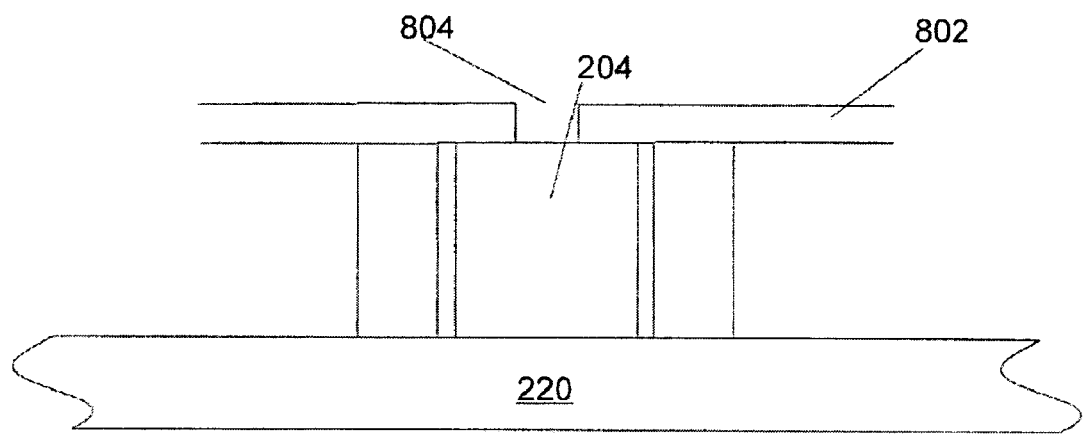
Figure 8B:
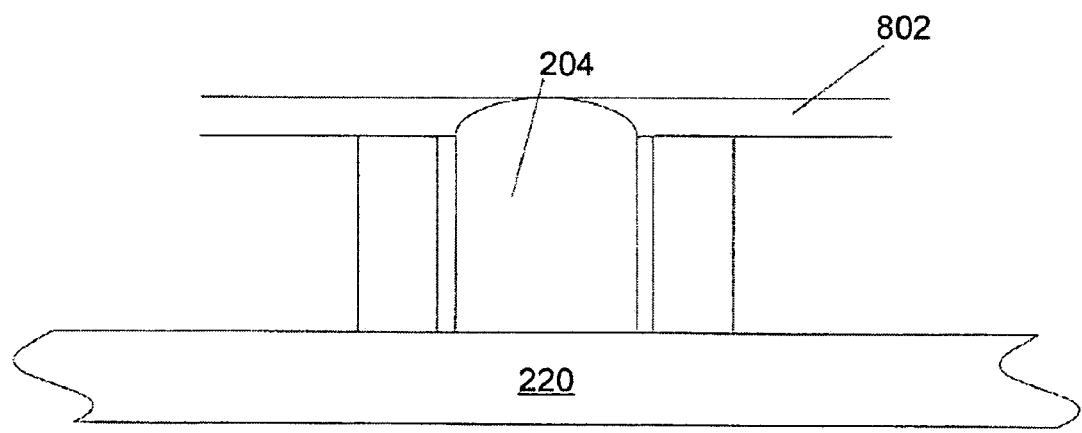

FIGS. 8A and 8B illustrate two methods of forming the contact opening to the pillar diode 204. In FIG. 8A, a second dielectric material 802 is deposited and a contact opening 804 is etched into the second dielectric material 802 to the top of the pillar diode 204.

In an alternative process illustrated in FIG. 8B, the diode pillars are crown etched as shown. The etchant also erodes the top of the line conductor 104 and the first dielectric 602 at a faster rate than the silicon. A second dielectric material 802 is then deposited. The structure is then planarized to expose the crown of the pillar diode 204 for contact therewith.

Figure 9:
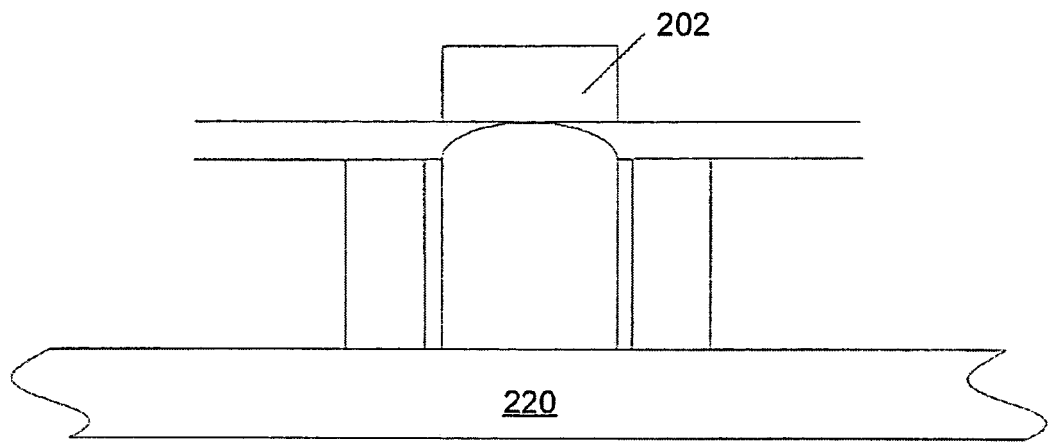
Figure 10:
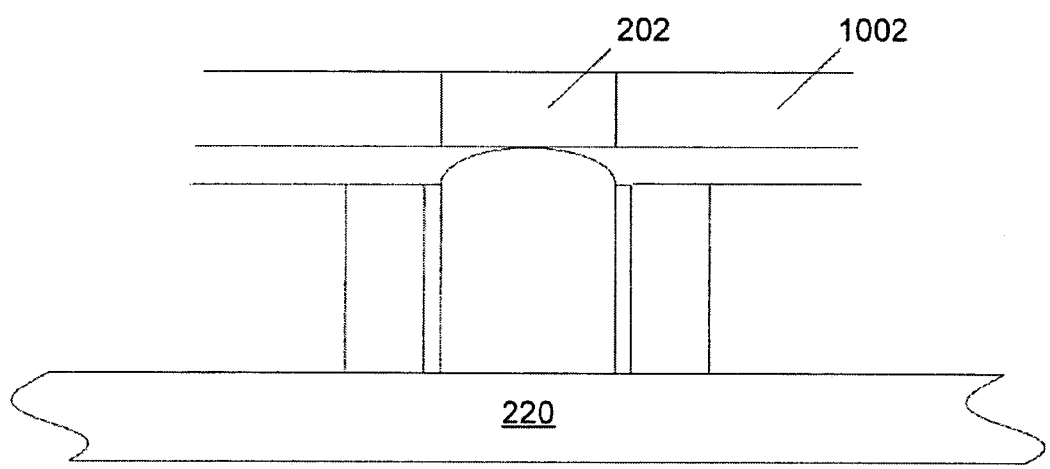

FIG. 9 schematically illustrates the deposition of the magnetic storage element 202 in contact with the top of the diode pillar 204. This may be achieved by building up the individual layers 208, 210, 206 of the magnetic storage element and then patterning to form the individual magnetic storage elements of each cell. As shown in FIG. 10, a third dielectric material 1002 is then deposited and planarized to expose the top of the magnetic storage element 202.

Figure 11:
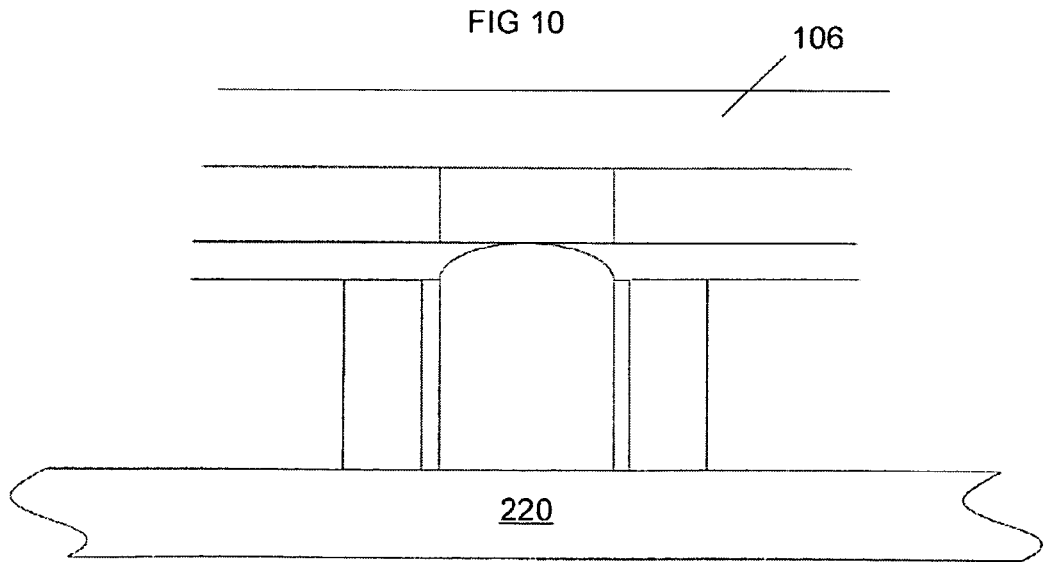

In FIG. 11, a top dielectric (not shown) is deposited and patterned to form trenches where the rows of top conductors will be formed. The structure is then copper plated by a copper damascene process. The copper is then etched back to form the top metal conductors separated by the top dielectric material.

In accordance with a second aspect of the present invention a magnetic memory cell has a magnetic storage element coupled with a current control element to control current flow through the magnetic storage element. The magnetic storage element has a plurality of layers including a first magnetoresistive layer and a second magnetoresistive layer separated by a non-magnetic layer. The current control element includes a first region of material of a first conducting type and the second region of material of a second conductive type. A junction is defined between the first conducting type material and the second conducting type material. The junction extends transversely to each of the layers in the magnetic storage element.

A method of constructing the memory cell set out above is also within the scope of the present invention.

What is claimed is:

1. A magnetic memory cell comprising:
 a magnetic storage element, the magnetic storage element having a plurality of layers including a first magnetoresistive layer and a second magnetoresistive layer and a non-magnetic material layer therebetween;
 a current control element coupled to the magnetic storage element to control current flow therethrough, the current control element including a first region of material of a first conductive type and a second region of material of a second conductive type and defining a junction therebetween, wherein the junction extends transversely to each of the layers in the magnetic storage element; and
 wherein the first region of the current control element is in the form of a core and the second region is in the form of a circumferential layer formed on the core, wherein the first and second regions form a pillar structure wherein the pillar structure is disposed within a first conductor line such that the first conductor line surrounds the sides of the pillar structure.

2. The magnetic memory cell as claimed in claim 1 wherein the magnetic storage element is connected to the core at one end of the pillar structure.

3. The magnetic memory cell of claim 1 wherein the current control element comprises a diode.

4. The magnetic memory cell of claim 1 wherein the first region.

5. The magnetic memory cell of claim 1 wherein the first region is in the form of a silicon core and the second region is in the form of a circumferential layer of metal silicide formed on the core, the junction between the first and second regions comprising a pn junction of a Schottky diode.

6. The magnetic memory cell of claim 5 wherein the second region is platinum silicide.

7. The magnetic memory cell of claim 1 wherein the magnetic storage element and the current control element are integrated.

* * * * *